United States Patent [19]

Wu et al.

[11] Patent Number: 4,560,879

[45] Date of Patent: Dec. 24, 1985

[54] METHOD AND APPARATUS FOR IMPLANTATION OF DOUBLY-CHARGED IONS

[75] Inventors: Chung P. Wu, Hamilton Township, Mercer County; Frank Kolondra, Delaware Township, Hunterdon County, both of N.J.

[73] Assignee: RCA Corporation, Princeton, N.J.

[21] Appl. No.: 532,899

[22] Filed: Sep. 16, 1983

[51] Int. Cl.[4] .............................................. G21K 5/00
[52] U.S. Cl. ................................ 250/492.2; 250/281; 250/423 R
[58] Field of Search ................. 250/492.2, 492.3, 281, 250/282, 294, 298, 299, 396 R, 398, 399, 423 R, 492.21

[56] References Cited

U.S. PATENT DOCUMENTS

| | | | |
|---|---|---|---|
| 3,579,270 | 5/1971 | Daly | 250/294 |
| 4,205,232 | 5/1980 | Maixner et al. | 250/397 |
| 4,263,097 | 4/1981 | Ohkawa | 376/123 |
| 4,283,631 | 8/1981 | Turner | 250/492 B |
| 4,383,180 | 5/1983 | Turner | 250/492.2 |

OTHER PUBLICATIONS

C. P. Wu et al., "Electron–Flood Techniques to Neutralize Beam Charging During Ion Implantation," RCA Review, vol. 44, Mar. 1983.

*Primary Examiner*—Bruce C. Anderson
*Assistant Examiner*—Paul A. Guss
*Attorney, Agent, or Firm*—Birgit E. Morris; Donald S. Cohen; Joseph D. Lazar

[57] ABSTRACT

An ion implantation apparatus and method are disclosed for reducing contamination of doubly-charged ions by singly-charged ions. A liner, with a grooved or smooth surface, formed of beryllium or graphite reduces secondary electron scattering into the ion beam. Solid red phosphorus reduces the operating vacuum thereby reducing contamination.

15 Claims, 12 Drawing Figures

METHOD AND APPARATUS FOR IMPLANTATION OF DOUBLY-CHARGED IONS

This invention relates to ion implantation apparatus, and in particular, to such apparatus for providing doubly-charged ions with reduced contamination by singly-charged ions.

BACKGROUND OF THE INVENTION

The irradiation of metals and semiconductor materials by an ion beam provides a means for effecting the doping of such materials in a controlled and rapid manner. Ion implantation, as the process is known, is accomplished by irradiating, for example, a semiconductor wafer with an ion beam of controlled intensity for such integrated exposure as needed to provide the desired dopant or impurity concentration. See U.S. Pat. Nos. 4,283,631 and 4,383,180, issued to N. Turner for descriptions of typical ion implantation apparatus.

It is well known that ion beams of twice the final energy for a given acceleration voltage can be obtained in many ion-implanter machines by using doubly-charged ions. Doubly-charged ions can be provided by controlling the analyzer magnetic field in ion implantation apparatus in a similar manner as one provides singly-charged ions. However, a doubly-charged ion beam can be contaminated with lower energy ions which are singly-charged. This form of contamination is prevalent in ion implanters which analyze the mass of the ion beam in the analyzer magnetic field at a relatively low voltage, usually in the order of 25 to 35 kilo-electronvolts (keV), prior to the final acceleration of the desired doubly-charged ions to higher voltages. During this phase of operation of the ion implanter, the doubly-charged ions are contaminated in any one or more of the following ways. First, contamination can occur from the dissociation of molecular ions, for example, phosphorus molecular ions ($P_2^+$) and arsenic molecular ions ($As_2^+$), in the region between the source of the ions and the analyzer magnet. As known, the analyzing magnet is a mass momentum analyzer and operates on the mass energy of a particular specie. For example, when a phosphorus molecular ion ($P_2^+$) at 25 keV dissociates into a singly-charged phosphorus ion ($P^+$) and neutral phosphorus atoms ($P^0$) with energy at 12.5 keV each, the singly-charged phosphorus ion ($P^+$) at 12.5 keV cannot be separated from the doubly-charged phosphorus ions ($P^{++}$) at 25 keV by the analyzer magnet since both the ions have the same energy per unit charge.

Second, the beam can be contaminated by those doubly-charged $P^{++}$ ions which have picked up secondary electrons in the acceleration column of the ion implantation apparatus to form singly-charged ions. The secondary electrons are scattered in the direction of the ion beam. Thus, the electrons (e) attracted in the doubly-charged phosphorus ions ($P^{++}$) result in a singly-charged phosphorus ion ($P^+$). This event can be represented as $P^{++} + e \rightarrow P^+$.

Third, the doubly-charged $P^{++}$ ions attract electrons by means of collisions with residual gas molecules (X) in the acceleration column. This process can be represented as $$P^{++} + X \rightarrow P^+ + X^+$$

where X denotes an unknown particle or atom, such as an oxygen or nitrogen atom.

Accordingly, it is clear there is a need to reduce the contamination of doubly-charged ion beam by singly-charged ions in ion implantation processes.

SUMMARY OF THE INVENTION

The invention provides for a liner, preferably grooved, on at least the outer arcuate wall of the analyzer magnet in an ion implanter. The liner, with either smooth or grooved surfaces, is formed of graphite or beryllium to generate less secondary electrons from impinging ions. When the liner is grooved, secondary electrons are scattered away from the ion beam.

DETAILED DESCRIPTION OF THE PREFERRED EMBODIMENT

Figure 1:
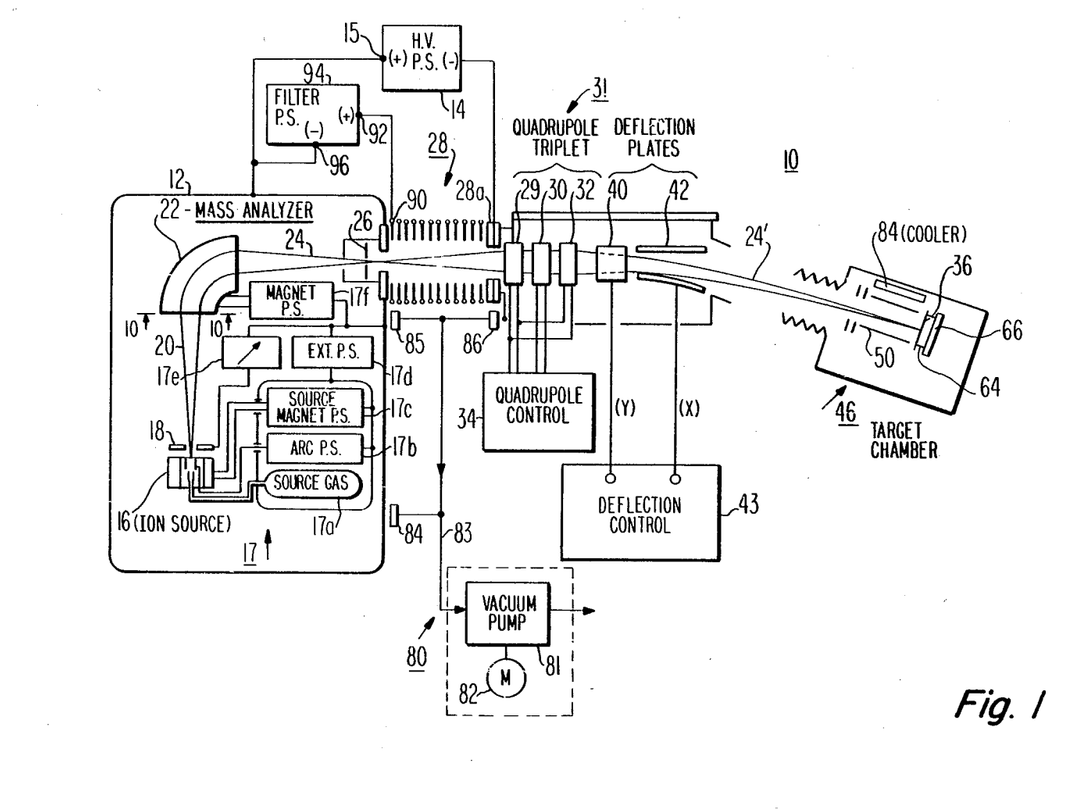
FIG. 1 is a schematic block diagram of an ion implantation apparatus incorporating the present invention.

The invention is useful in an ion implantation system of the type as shown in FIG. 1. The ion implantation apparatus 10 includes a high voltage terminal 12 maintained at a high positive potential relative to a reference potential, such as ground, by a high voltage power supply (HVPS) 14. Supply 14 provides a selected voltage typically in the range of 0 to 280 keV. Terminal 12 includes structure to house the portion of the implantation apparatus 10 required to form a beam of ions of desired species. In practice, a gaseous feed stock of the desired species is employed such as from a source 16 to provide ions of various forms including singly- and doubly-charged ions of the desired specie. A typical ion source 16 will require a system supply 17 within the terminal housing 12 to maintain the ionized discharge, and to impose axial magnetic fields across the discharge region and an extraction supply cooperating with the electrode 18 to shape the electric field at the aperture of the source 16 for effective development of a well-defined high current ion beam 20. Thus, supply 17 will include a source gas 17a directed to ion source 16. Supply 17 further includes an arc power supply 17b to sustain an ionizing discharge, a power supply 17c to impose an axial magnetic field across the discharge region, and extraction and power supply 17d, and vernier 17e cooperative with the electrode 18 to shape the electric field at the aperture of the ion source 16 for effective control of a well defined high current ion beam 20.

The ion beam 20 diverging from the source 16 is momentum analyzed by an arcuate-shaped mass analyzer 22 to provide the desired doubly-charged ion beam 24. A magnet of analyzer 22 is energized by magnet power supply 17f. The analyzed ion beam 24 passes through the analyzer exit slit 26 and then to an accelerator tube 28 where it encounters a carefully designed field gradient from the high, relatively positive, voltage terminal 12 to a relatively negative or ground potential terminal 28a. An electrical optical device such as a conventional "quadrupole triplet" 31 comprising control elements 29, 30 and 32 under control of a quadrupole control 34 is operated to produce spatial-energy focus of the beam at a desired image plane. Two sets of electrostatic deflection plates 40 and 42 serve to direct the beam over the desired area of the image plane 36 in the target chamber 46. A suitable deflection control 43 is provided to control the deflection plates 40 and 42 arbitrarily labeled y and x, respectively.

Assuming the ion source 16 is arranged to provide gaseous phosphorus ions, the beam 20 will contain a mixture of singly-charged and doubly-charged phosphorus ions that will be guided to the mass analyzer 22. The magnet of analyzer 22 is suitably provided with appropriate currents as known in the art to separate the particles in the beam 20 into the desired mass of the ion. The doubly-charged ions of phosphorus will traverse the arcuate path defined by the analyzer 22 and will exit as a beam to define the doubly-charged beam 24 of phosphorus ions. The analyzer 22 will separate from the beam 20 all particles that are not of the same mass and charge as the mass and charge of phosphorus. Thus, neutral atoms of phosphorus will be separated and deposited on the walls of the analyzer. Doubly-charged ions of phosphorus will be typically at an energy level of 25 keV. However, singly-charged phosphorus ions (P+) will, in the process, be separated or dissociated from the molecular ions ($P_2^+$). Such singly-charged phosphorus ions (P+) will be at an energy that is half of that of the doubly-charged ions (P++), namely at 12.5 keV. However, the singly-charged phosphorus ions at 12.5 keV will continue in the beam.

A conventional vacuum pumping apparatus 80, including a pump 81 and a meter 82, provides vacuum in the system by way of conduit 83 coupled to connectors 84, 85, 86, etc., suitably attached to selected portions of the apparatus 10. In a typical system, using gaseous phosphorus as the ion source 16, the vacuum will be $2 \times 10^{-5}$ torr at source 16, $1 \times 10^{-6}$ torr in the accelerator column 28, and $1 \times 10^{-7}$ torr in the target chamber 46.

In typical operation, a target device, typically a wafer 64, is mounted on a platen support 66. In practice, the support 66 will include a conventional wafer carrier mechanism (not shown) for carrying and positioning in sequence a plurality of wafers 64 to and from the ion implant position plane 36 (FIG. 1). The ion beam 24' after it passes through the deflection plates 40 and 42, as shown in FIG. 1, is passed into the target chamber 46, typically formed with a Faraday cage 50. The system of FIG. 1, providing an ion beam 24' to the chamber 46, is operated in a conventional manner and accordingly need not be described in detail herein.

However, the beam 24', desirably containing only doubly-charged ions, can be contaminated, for the reasons explained hereinabove. The invention provides for reducing or eliminating one or more of the contaminants listed above, as will now be described.

Low energy contaminants in the doubly-charged ion beam due to the dissociation of molecular ions in the analyzer magnet 22 can be eliminated by providing an electrostatic beam filter 90 between mass analyzer 22 and the acceleration column 28 as shown in FIG. 1. The electrostatic beam filter 90 is formed of a lens element formed of an annular plate, preferably the first annular electrode of the acceleration column 28. Filter 90 is connected to a terminal 92 at which voltages of selected value can be applied by a filter power supply 94. Power supply 94 provides a positive voltage of approximately 20 keV at terminal 92 relative to the voltage at power supply terminal 96. Terminal 96 is commonly connected to positive voltage terminal 15 of high voltage power supply 14 which provides a voltage of, for example, 180 keV. The filter 90, is thus biased at about 20 keV positive relative to terminal 12 which, in one example, is 140 keV positive, relative to terminal 28a. Filter 90 will function to act as a mirror or reflector of particles that are passing from the analyzer into the acceleration column 28 having an energy less than the positive bias voltage of 20 keV. Accordingly, phosphorus ions (P+) having an energy of 12.5 keV will be repelled by the relatively positive bias of the filter 90. However, all ions having energy momentum greater than 20 keV will not be inhibited by the filter 90 and will pass into the acceleration column 28 which forms and accelerates the beam 24' eventually to strike the target 64. It should be appreciated, as explained above, that the molecular ions ($P_2^+$) can dissociate in the mass analyzer 22 into P+ and $P^0$ particles. The P+ ions cannot be mass analyzed and separated by the magnet since they have the same mass per unit charge as P++ at 25 keV. The $P^0$ particles, however, will pass to the wall without deflection.

The P+ ions at 12.5 keV, however, are not the only low energy contaminants in the desired doubly-charged phosphorus beam (P++) beam. The other kinds of low energy contaminants may come from P++ ions attracting secondary electrons scattered in the direction of the ion beam 24 passing through the mass analyzer, particularly from the analyzer magnet with conventional (aluminum) lining material, or by collision with residual particles in the acceleration column 28.

Figure 2A:
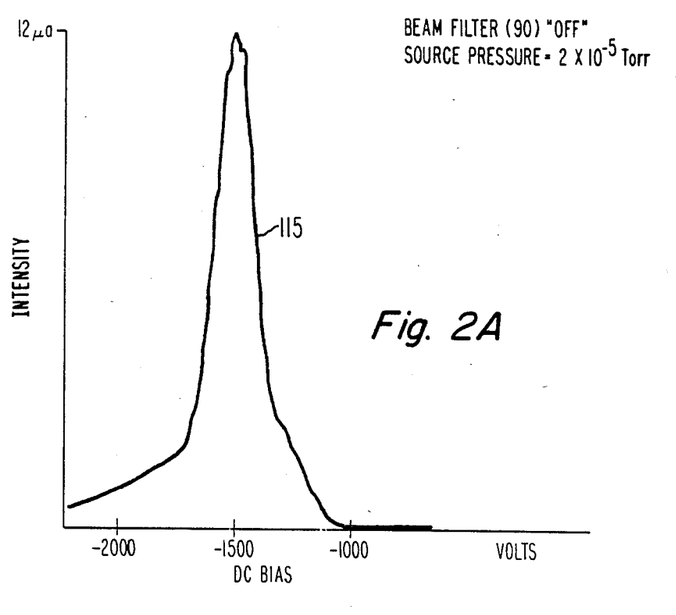
FIG. 2A and FIG. 2B are, respectively, curve plots of experimental data illustrating the effectiveness of a beam filter in reducing beam contaminants.
Figure 2B:
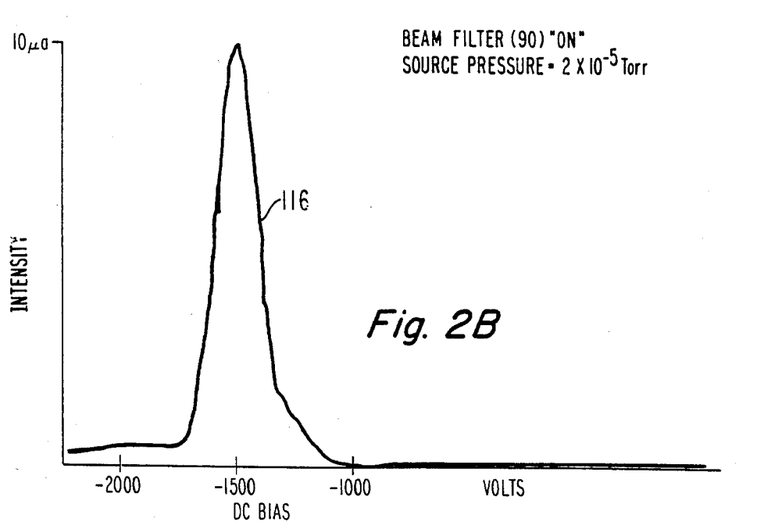

Experiments were made to determine qualitatively the effectiveness of the use of the electron beam filter 90 as illustrated by the data shown in FIGS. 2A and 2B. FIGS. 2A and 2B are curve plots of beam intensity in microamperes ($\mu a$) as the DC bias voltage on horizontal deflection plates 42 is varied from at least $-2000$ volts, and greater than $-1000$ volts, showing the bias voltage at $-1500$ volts at which the respective peaks occur. The presence of low energy contaminants is observed by turning off the vertical beam scan of the apparatus 10 and recording the beam intensity in the center of the Faraday cage 50 as a function of DC bias on the horizontal beam scan on plates 42 of several kilovolts (1 to 8 kilovolts). FIG. 2B shows the recorded beam shape 116 at the ion source pressure of $2 \times 10^{-5}$ torr with the beam filter 90 turned on, namely, with a bias of $+20$ keV, while FIG. 2A shows the beam shape 115 with the filter 90 turned off. It can be seen by comparing the shapes of the two scan plots that with the filter 90 on, the low energy contaminants were substantially reduced as manifested by the reduced width of plot 116. In particular, the peak beam intensity of plot 116 is reduced to 10 $\mu a$ from the peak intensity of 12 $\mu a$ for curve 115. Moreover, the beam intensity in curve 116 (FIG. 2A) is reduced on the left side of the plot. Thus when the beam filter is "on", as shown in FIG. 2B, the contamination effects were reduced. It is noted that the source pressure of $2 \times 10^{-5}$ Torr was the same for the conditions of both FIGS. 2A and 2B.

Figure 3A:
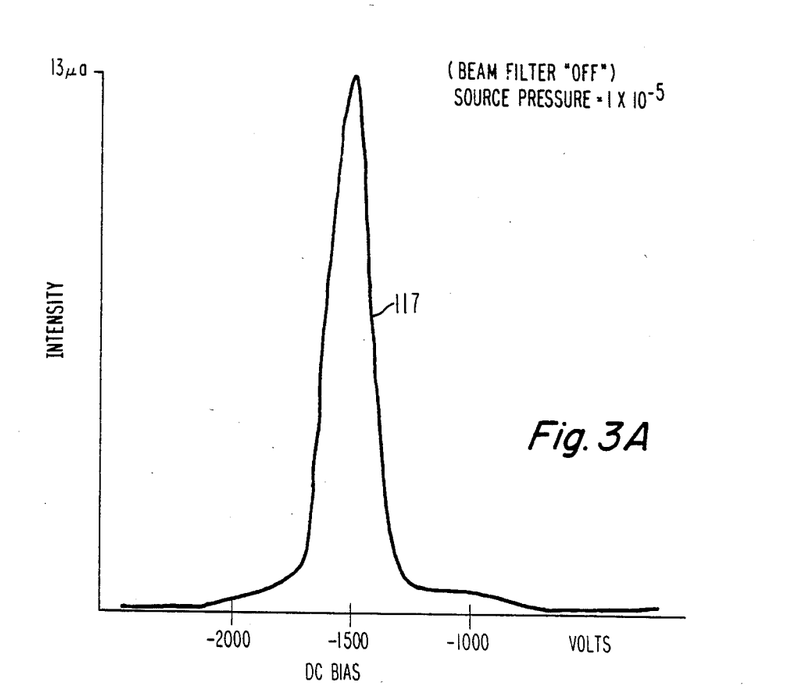
FIG. 3A and FIG. 3B are, respectively, curve plots similar to FIGS. 2A and 2B, but with reduced ion source pressure.
Figure 3B:
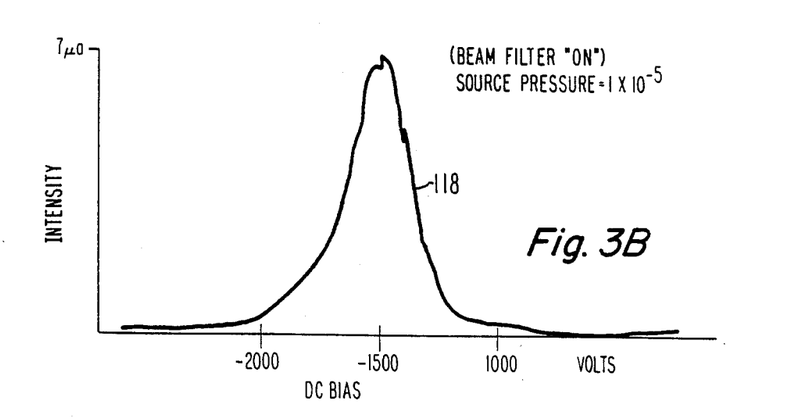

FIGS. 3A and 3B show the shape of the beams 117 and 118 respectively recorded at a source pressure of $1\times10^{-5}$ torr with the filter "off" and "on", respectively. FIGS. 3A and 3B are curve plots of beam intensity in microamperes ($\mu$a) as a function of the DC bias voltage, similar to that for FIGS. 2A and 2B. Note the reduction in peak intensity from 13 $\mu$a (FIG. 3A) to 7 $\mu$a (FIG. 3B). It is seen that the beam shape 118 of FIG. 3B resulted from the reduced source pressure. Moreover, the beam shape of FIG. 3B shows less contaminants than that shown by FIG. 3A because of the filter action. It is seen that while the shape of curve 118 (FIG. 3B) is thicker at the base portion than curve 117 (FIG. 3A), the reduced area under plot 118 is indicative of less contamination when the beam filter is "on".

Figure 4:
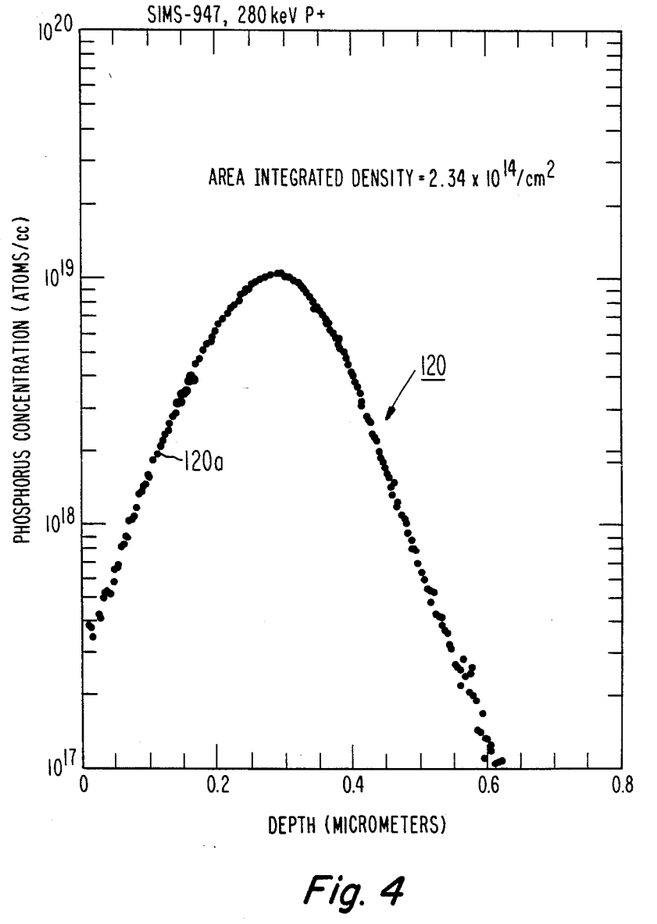
FIG. 4–9 are curve plots using SIMS (Secondary Ion Mass Spectroscopy) for analyses of samples illustrating the comparative effects of the invention.
Figure 5:
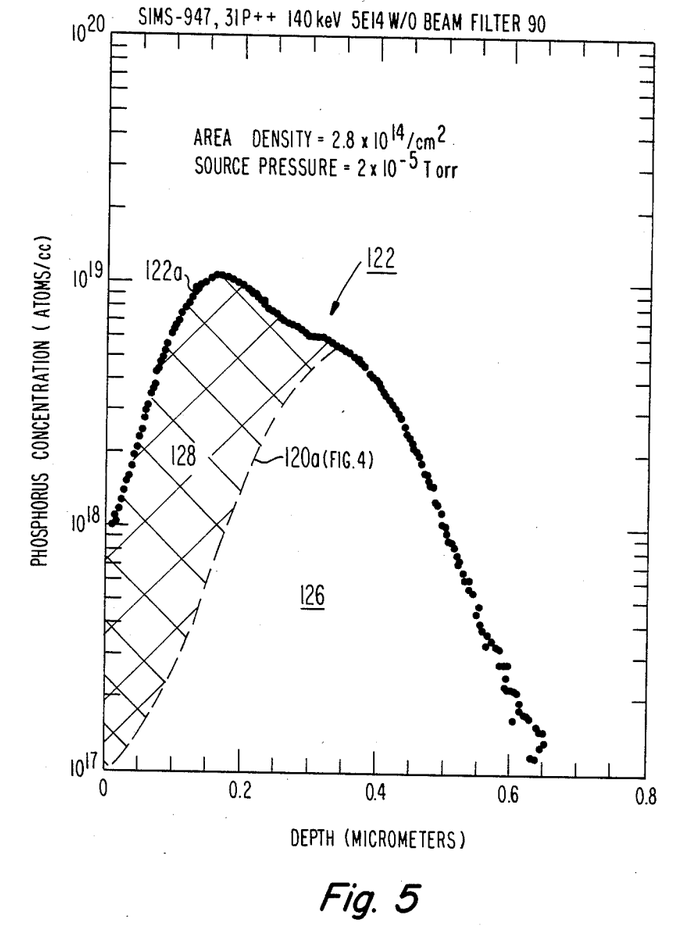
Figure 6:
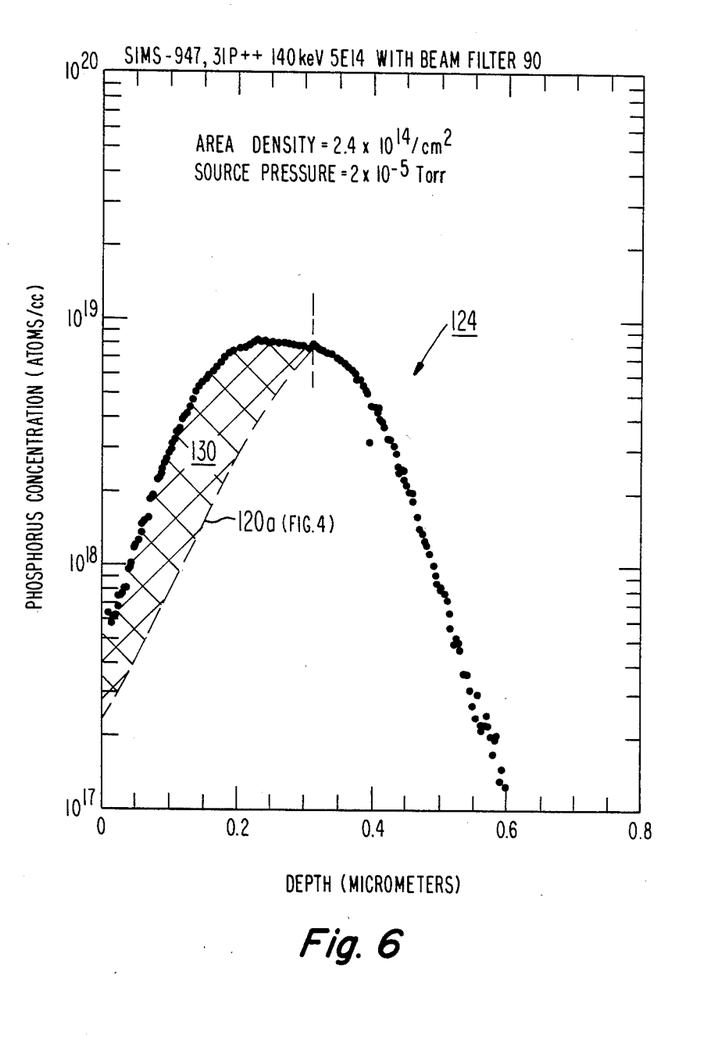

Further experiments were made to determine whether the use of the beam filter 90 would be a universal solution to all kinds of ion implanters. For example, tests were run on what is known as a Varion/Extrion type CF4-200 ion implanter and a Varion/Extrion CF4-3000 implanter. According to the tests performed, wafers were implanted with $^{31}$p++ ions at a beam voltage of 140 keV, with and without the beam filter 90 operating, with a dose of ions at $2.5\times10^{14}$ cm$^{-2}$. These test data were further compared with similar samples implanted with $^{31}$p+ at 280 keV in a different implanter which has a higher implant capability, using the SIMS (Secondary Ion Mass Spectrometer) apparatus for analysis. The results of such experiments are shown in FIGS. 4, 5 and 6 which are SIMS plots in conventional form. The data on the upper line of the figures refer to the one wafer of a batch tested on the SIMS (e.g. batch 947), using the identified ion (e.g. P+), at the designated acceleration voltage of power supply 14 (either 140 keV or 280 keV), with a dose of 5E14 (meaning $5\times10^{14}$ ions per cm$^2$) and with or without (w/o) the beam filter 90 energized. Moreover, the figures indicate the areal density, i.e. the integration under the curve of the total dose, and the pressure of the source 16, in torr.

FIG. 4 shows the profile 120 by SIMS analysis of a wafer implanted with singly-charged phosphorus ions ($^{31}$P+) at 280 keV by power supply 14. This profile 120 is free of contaminants and, thus, serves as a control sample to compare to other profiles. This control profile 120 is free of contaminants since it is formed by singly-charged ions but at twice the voltage at which a doubly-charged ion beam will be operated. FIGS. 5 and 6 show the profiles 122 and 124 of a wafer implanted with doubly-charged ions ($^{31}$P++) at 140 keV without and with, respectively, the beam filter 90, at a source pressure of $2\times10^{-5}$ torr, which is a typical vacuum for gaseous phosphorus (PH$_3$). The pressure for the profile of FIG. 4 is not critical since the beam is composed of singly-charged particles that are not subject to contamination. Profile 120 of FIG. 4, when superposed over curve 122 of FIG. 5 shows a common portion 126 and a difference portion 128 defined by a portion 122a of profile 122 and portion 120a of profile 120, shown dotted in FIG. 5. The difference portion 128, shown in dashed lines in FIG. 5, represents the contaminants in the beam of doubly-charged ions that generated the profile 122, without beam filter 90 operating. Similarly, the difference portion 130 in FIG. 6 represents the contaminants in the beam but with beam filter 90 on. It is apparent that the beam filter 90 removed a large portion of the low-energy contaminants, but not all the contaminants. The surface concentration of implanted ions ended up with a factor of two higher as compared with the control sample, indicating that some contaminants are not removed by the beam filter 90.

Thus, it is seen that the low energy contaminants caused by dissociation of the molecular ions can be substantially reduced by the electron beam filter 90 operating at a voltage that is slightly greater than the energy of the low energy contaminants but not so large as to screen out or filter out the desired high energy doubly-charged ions (for example, $^{31}$P++ ions).

Moreover, contaminants can be further reduced by reducing the source pressure as demonstrated by FIGS. 3A and 3B compared to FIGS. 2A and 2B.

We have discovered that forming the liner of the magnet analyzer 22 from either graphite or beryllium reduced the generation of secondary electron generated from the liner and, thus, reduced the scattering effects of the secondary electrons into the beam. Both graphite (carbon) and beryllium having a lower atomic number (Z number), that is, the proton number in the nucleus of the atom is lower, therefore, such materials generate less secondary electrons for each impinging ion.

The number of secondary electrons scattered in the direction of the ion beam exiting from the analyzer magnet 22 can still be further reduced significantly by providing grooves in the liner surface so that the scattering plane of electrons is tilted away from the plane of the ion beam 20 entering and exiting the analyzer magnet. The plane of the beam 20 passing through the analyzer 22 is defined by the plane containing the arcuate portion of the beam. Accordingly, the direction of the grooves in the lining materials should run in any direction except that direction which is in the vicinity of the normal to the plane of the ion beam 20.

Figure 10:
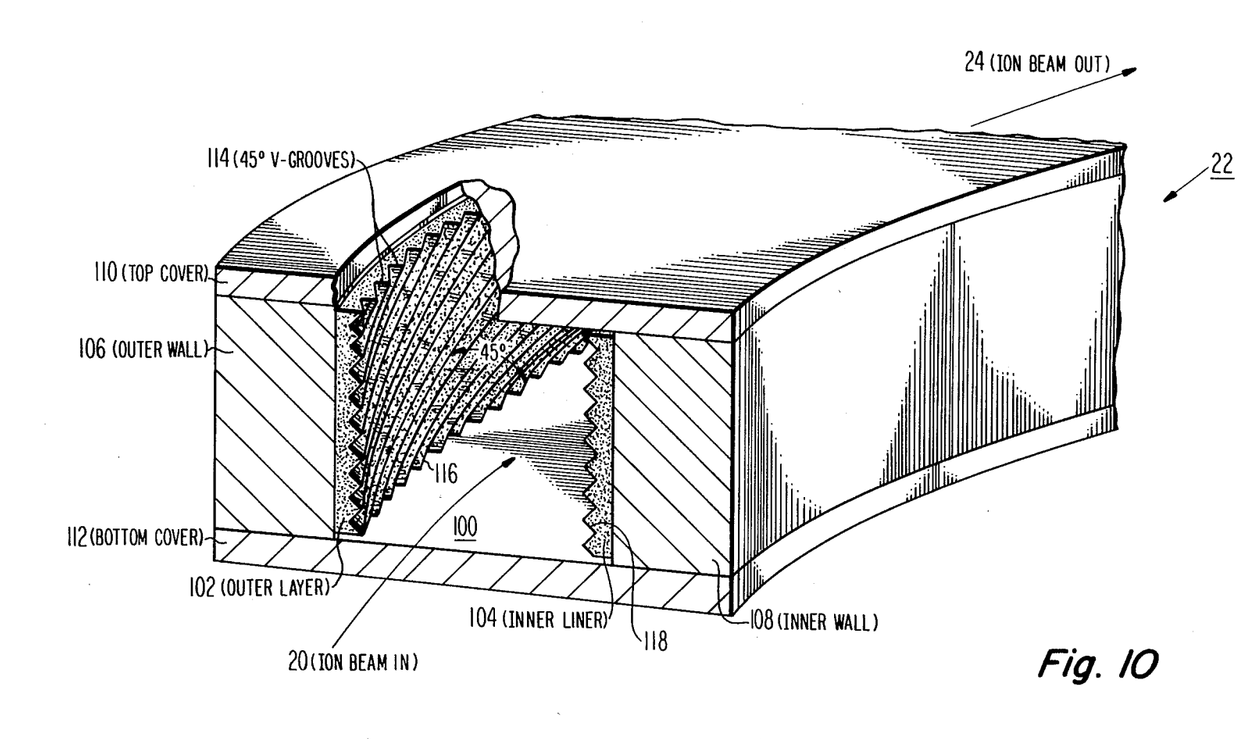
FIG. 10 is a perspective schematic, partly in section, of the analyzer portion of the apparatus of FIG. 1 as seen along viewing line 10—10 thereof.

Reference is made to FIG. 10 which illustrates one form of such a grooved liner. FIG. 10 shows in perspective, and partly in section, the hollow, arcuate-shaped analyzer 22 with the ion beam 20 entering the arcuate passageway 100. The arcuate path of beam 20 in passing through the arcuate passageway 100 of the analyzer 22 defines what is, termed herein, the plane of the beam. The liner to the analyzer 22 is formed of an outer liner 102 and an inner liner 104. The liners 102 and 104 are formed of either beryllium or graphite and are suitably attached, respectively, to the outer magnet wall 106 and the inner analyzer wall 108. A top cover 110 and a bottom cover 112 of the analyzer 22 close the passageway. Liners, not shown, may be provided on the top and bottom covers. The walls and covers of the analyzer are formed of non-magnetic material such as stainless steel. The required magnetic field for analyzing the ion beam is formed by a coil, not shown, surrounding the magnet 22.

In one embodiment, only one liner need to be formed of beryllium or graphite, namely, the outer liner 102. The inner liner 104 may be formed of aluminum, in the conventional manner. The inner surface of liner 102 is smooth. The lower Z number of the beryllium or graphite, as compared to the higher Z number of aluminum, which is conventionally used as liner material, serves to reduce the amount of secondary electrons that are generated and scattered from the surface of liner 102 in response to ions which may impact the surface.

As indicated above we have discovered, however, that by providing grooves 114 in the inner surface of the outer liner 102, scattering secondary electrons to the ion beam is significantly reduced. V-grooves 114 are cut at 45° into the inwardly facing surface of liner 102 providing groove faces that are perpendicular to each other. In this embodiment the grooves extend along a line that is at a 45° slant relative to the plane of the beam, as indicated by lines 116. The grooves 114 are cut to a depth and pitch, respectively, in the range of ¼ to 1/16 inch. Only a limited number of grooves are shown in FIG. 10 within the partial breakaway, it being understood that the entire surface of the liner is provided with such grooves. With the grooves 114 as shown, particles that are scattered will not be predominantly in the plane defined by the beam 20 since the scattering angle will not be in the plane of the beam.

What is critical in formation of the grooves is the electron scattering angle relative to the plane of the ion beam. V-grooves that extend perpendicular to the plane of the beam will scatter electrons, contrary to the purpose of this invention, into the plane of the beam. Accordingly, such perpendicular V-grooves are not used according to this invention. According to this invention, there should be a sufficient angle of skew to scatter electrons away from the plane of the ion beam. The 45 degree slant angle of the 45° V-grooves illustrated in FIG. 10 satifies the criterion and is quite convenient to fabricate. Other skew angles and groove forms may be used as desired that satisfy this criterion.

In another embodiment, the inner liner 104, in addition to liner 102, is also formed to beryllium or graphite with a smooth surface, but preferably with grooves 118 similar to grooves 114 of liner 102.

In a still further embodiment the inner surface of the top and bottom passageway covers 110 and 112, respectively, is provided with a liner, not shown, of similar form. The grooves, if provided on such cover liners, are not critically limited in direction and form as grooves 114 and 118 since the scattering process will not cause the electrons to go into the plane of the beam 20 but rather at an angle skewed to the beam plane.

Figure 7:
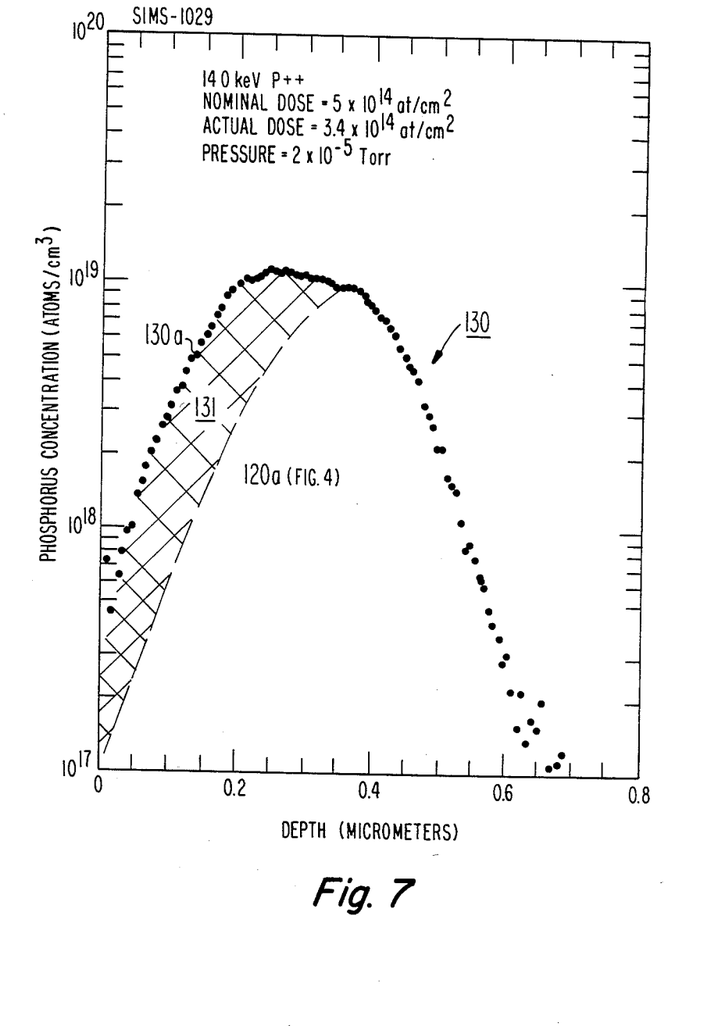
Figure 8:
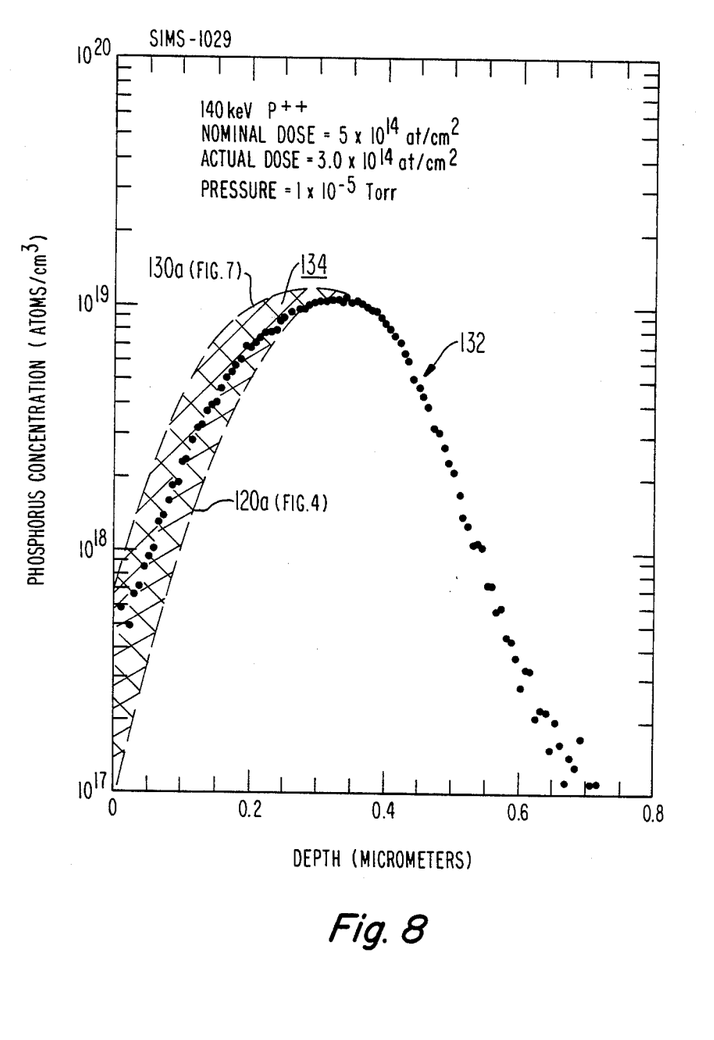

Reference is now made to FIG. 7 which shows a doubly-charged phosphorus ion ($^{31}P^{++}$) profile 130 obtained under operating conditions as described above after the installation of a grooved liner 102 made of graphite. The other three liners were of conventional form, that is, were formed of smooth aluminum. A comparison of the profile 130 to profile 120 (FIG. 4) shows a contamination portion 131. The contamination portion 131 compared to the contamination portion 130 of FIG. 6 shows that a reduction in the contamination by the use of the liner 102 is slight. Nevertheless, by reducing the pressure of the gaseous source 16 from $2 \times 10^{-5}$ torr to $1 \times 10^{-5}$ torr contamination was reduced as shown in the profile 132 of FIG. 8. Profile 132 compared to profile 130 (FIG. 7) shows that the contamination portion 131 of FIG. 7 compared to the corresponding contamination portion 134 of FIG. 8 has been reduced significantly by the reduction in source pressure from 2 (FIG. 7) to $1 \times 10^{-5}$ torr (FIG. 8).

According to another feature of the invention, still further reduction in contamination of the doubly-charged ion beam is achieved by using solid red phosphorus for the ion source 16 rather than the gaseous form ($PH_3$) of phosphorus. Experiments with a solid phosphorus ion source shows that the operating pressure at the ion source was reduced by two orders of magnitude, namely to about $2 \times 10^{-7}$ torr. We have discovered further contrary to what would be expected that there is no penalty in the reduced ion beam current that was experienced by the reduction in the pressure of the $P^+$ of $P^{++}$ ion source.

Figure 9:
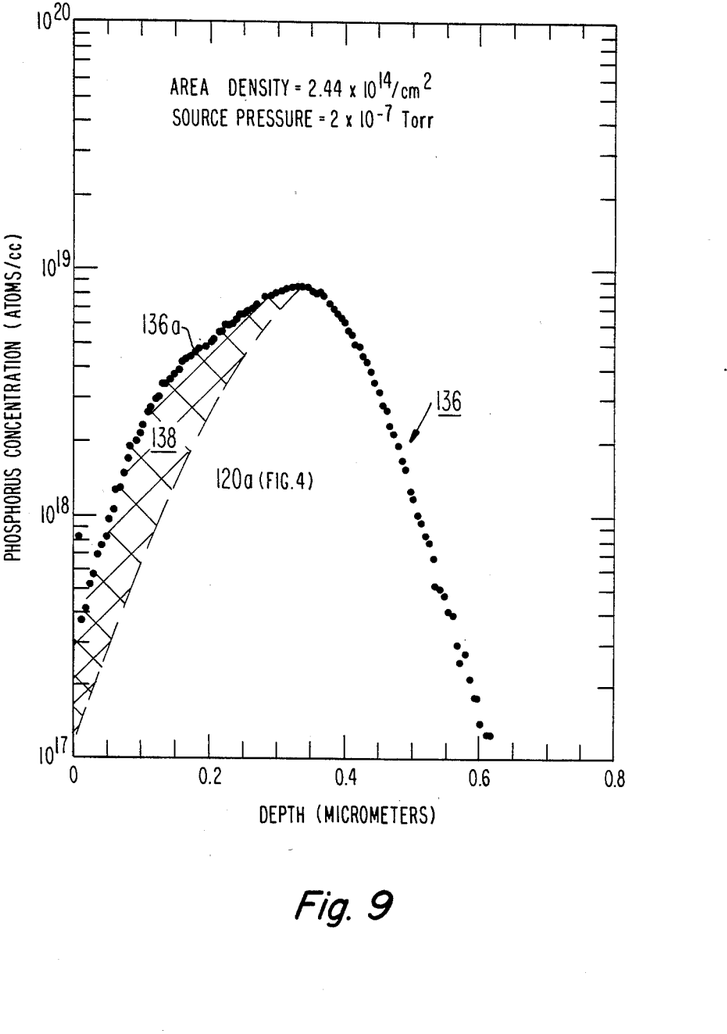

Data for experiments using red phosphorus in solid form as a source of the $p^{++}$ ions is shown in FIG. 9. Profile 136 in FIG. 9 compared to the control sample profile 120 (FIG. 4) shows a contaminant region 138 that is reduced as compared to region 131 of FIG. 7. Profile 136 was made with a conventional smooth-surfaced aluminum liner 102 or 104. However, since the system could operate with a significant improvement in the vacuum ($10^{-7}$ torr as compared to $10^{-5}$ torr for the gaseous ion source) the reduction in contamination by the use of solid red phosphorus is significant.

While the embodiments of the invention have been described with the use of phosphorus in gaseous or solid form as the ion source, it should be appreciated that the invention can be practiced with a source of ions from boron or arsenic. While solid forms of boron are available, they may be difficult to use. Moreover, since no double-charged boron ions exist (as presently known), the beam filter 90 would not be needed. Arsenic exists in solid form and accordingly would be useful in practice of the invention.

What is claimed is:

1. In a vacuum ion implantation system for irradiation of a device comprising ion source means for providing a beam of ions comprising doubly charged ions, arcuate shaped magnetic analyzer means for selecting ions of predetermined mass to form said beam, said magnetic analyzer means including a hollow magnetic chamber having an inner wall, an outer wall and a top wall and a bottom wall defining an arcuate passageway through which said ion beam passes, the arc of said analyzer means defining the travel plane of said ion beam, optical means, including an ion acceleration column, for forming and focusing said beam, and ion scanning means for scanning said beam over the device, wherein the improvement comprises:

a liner formed of graphite or beryllium positioned on said outer arcuate wall, said liner having grooves in said wall facing said passageway and shaped to scatter said secondary electrons into a plane that is tilted away from the plane of the ion beam, whereby secondary electrons generated by said ion beam impacting said outer wall liner are scattered away from said ion beam.

2. A system according to claim 1 further including said liner positioned on the inner arcuate wall of said chamber.

3. A system according to claim 3 wherein said grooves are V-shaped at a 45° angle and the edges of said grooves extend on the surface to form a 45° angle with the extension of the plane of said beam.

4. A system according to claim 2 further including a liner formed of beryllium or graphite positioned on each of the top and bottom wall surfaces of said magnetic chamber facing said passageway.

5. The system of claim 4 wherein said top and bottom wall liners have grooves facing said passageway and shaped to scatter said secondary electrons into a plane that is tilted away from the plane of the ion beam.

6. A system according to claim 1 wherein the acceleration column is at a vacuum of $10^{-5}$ torr or lower whereby exchange reactions with residual gas molecules are reduced.

7. A system according to claim 1 wherein said ion source means consists essentially of solid material of red phosphorus.

8. A system according to claim 7 wherein the said system is operated at a vacuum of less than $2 \times 10^{-7}$ torr.

9. A system according to claim 8 wherein the acceleration column is at a vacuum of $10^{-5}$ torr or lower whereby exchange reactions with residual gas molecules are reduced.

10. A system according to claim 1 further including electrostatic beam filter means including an annular plate surrounding said beam and positioned between said magnetic analyzer means and said optical means, said filter biased at a potential greater than the potential of singly-charged ions but less than the potential of doubly-charged ions whereby said plate functions as an electrostatic mirror for ions with potential less than said bias potential and said beam comprises essentially only doubly-charged ions.

11. In a vacuum ion implantation system for irradiation of a device comprising ion source means for providing a beam of ions comprising doubly-charged ions, arcuate shaped magnetic analyzer means for selecting ions of predetermined mass to form said beam, the arc of said analyzer means defining the plane of said beam ion, optical means, including an ion acceleration column, for forming and focusing said beam, and ion scanning means for scanning said beam over the device, wherein said ion source means consists essentially of solid material of red phosphorus.

12. A method of reducing contamination of a doubly-charged ion beam by singly-charged ions in an ionic vacuum implantation apparatus of the type including an ion acceleration column means for forming and focusing said beam including an arcuate shaped analyzer magnet, and ion scanning means for scanning said beam over the device, wherein the improvement comprises the step of scattering secondary electrons from said beam into a plane that is tilted away from the plane of the ion beam by a liner in said analyzer magnet, said liner being formed with grooves and being further formed of graphite or beryllium.

13. The method of claim 12 further comprising reducing the vacuum in said acceleration column to reduce charge reactions with residual gas molecules therein.

14. The method of claim 12 comprising the step of providing red phosphorus as said ion source.

15. The method of claim 12 further including the step of filtering singly-charged ions from said beam by an annular electrostatic beam filter biased to a voltage higher than the energy of said singly-charged ions and lower than the energy of said doubly-charged ions.

* * * * *